(12) United States Patent
Shelnutt et al.

(10) Patent No.: US 9,392,726 B2
(45) Date of Patent: Jul. 12, 2016

(54) AIRFLOW CONTROL SYSTEM

(71) Applicant: Dell Products L.P., Round Rock, TX (US)

(72) Inventors: Austin Michael Shelnutt, Leander, TX (US); Travis Christian North, Cedar Park, TX (US); Christopher Michael Helberg, Austin, TX (US); Tyler Duncan, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 109 days.

(21) Appl. No.: 14/498,411

(22) Filed: Sep. 26, 2014

(65) Prior Publication Data

US 2016/0095250 A1    Mar. 31, 2016

(51) Int. Cl.
*G06F 1/20*       (2006.01)
*H05K 5/00*       (2006.01)
*H05K 7/20*       (2006.01)

(52) U.S. Cl.
CPC ........ *H05K 7/20145* (2013.01); *H05K 7/20209* (2013.01); *H05K 7/20718* (2013.01)

(58) Field of Classification Search
CPC .......... H05K 7/20145; H05K 7/20718; H05K 7/20209
USPC ....... 361/679.46–679.54, 688–723; 454/184–186, 188–193, 228–236
See application file for complete search history.

(56) References Cited

U.S. PATENT DOCUMENTS

| | | | |
|---|---|---|---|
| 2013/0025364 A1* | 1/2013 | Bach | F24B 5/02 73/204.23 |
| 2014/0064545 A1* | 3/2014 | Cohen | B23K 13/01 381/361 |
| 2014/0072164 A1* | 3/2014 | Cohen | H04R 1/086 381/359 |
| 2015/0043157 A1* | 2/2015 | Lai | H05K 7/20727 361/679.47 |

* cited by examiner

*Primary Examiner* — Anthony Haughton
*Assistant Examiner* — Yahya Ahmad
(74) *Attorney, Agent, or Firm* — Haynes and Boone, LLP

(57) ABSTRACT

An information handling system (IHS) cooling system includes a multi-IHS chassis having at least one fan system that produces an airflow. An IHS is positioned in the multi-IHS chassis. The IHS includes an IHS chassis that houses a processing system and a memory system. An airflow channel is defined within the IHS chassis and is configured to receive at least a portion of the airflow produced by the at least one fan system. An airflow impedance element is positioned in the airflow channel, and includes a first orientation in which the airflow impedance element extends into the airflow channel to impede airflow through the airflow channel. The airflow impedance element is configured to change shape as a function of temperature into at least one second orientation that reduces the impedance of airflow through the airflow channel. In some embodiments, the airflow impedance element is a bimetallic plate.

20 Claims, 12 Drawing Sheets

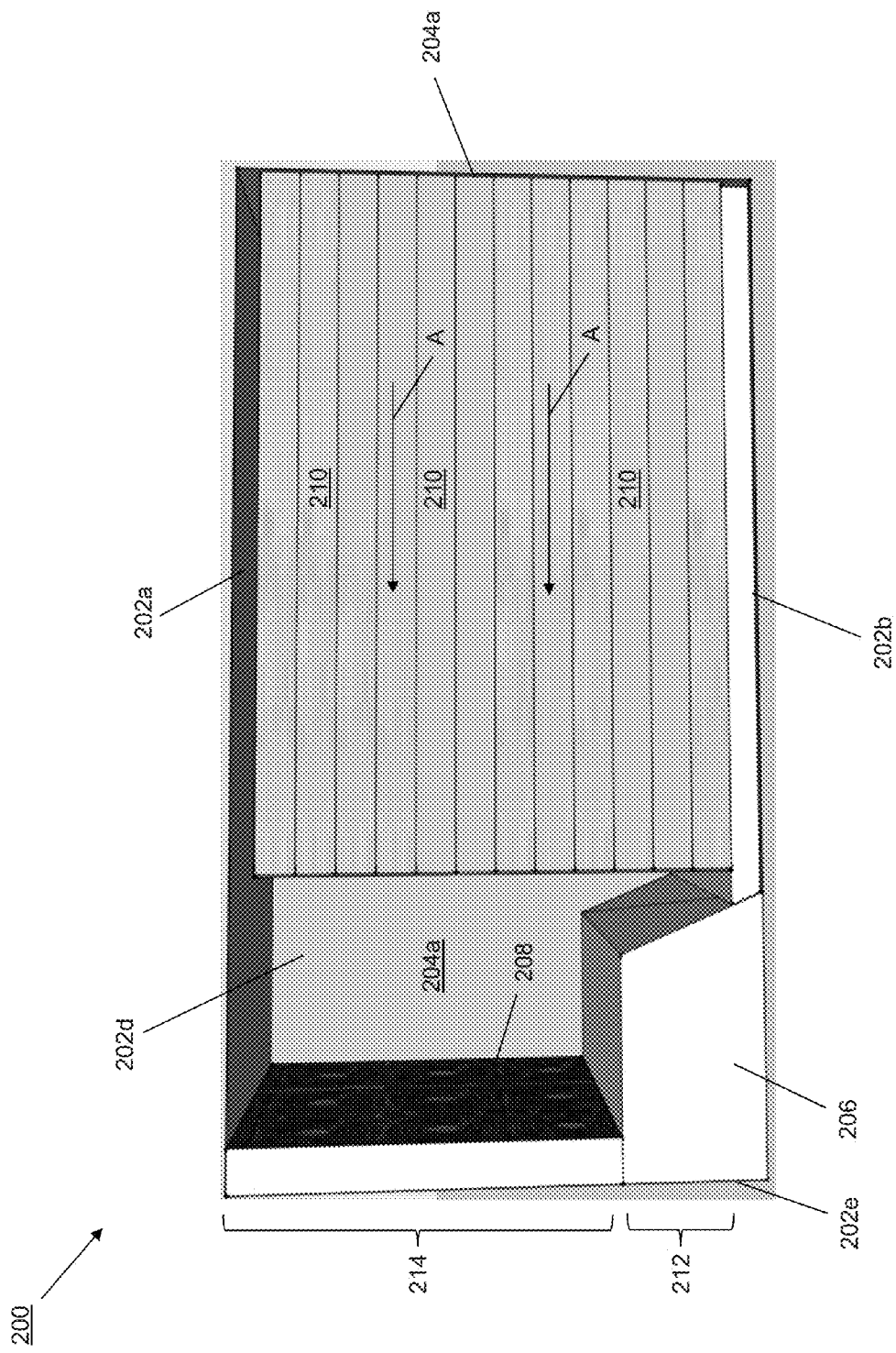

AIRFLOW CONTROL SYSTEM

BACKGROUND

The present disclosure relates generally to information handling systems, and more particularly to an airflow control system for an information handling system.

As the value and use of information continues to increase, individuals and businesses seek additional ways to process and store information. One option is an information handling system (IHS). An IHS generally processes, compiles, stores, and/or communicates information or data for business, personal, or other purposes. Because technology and information handling needs and requirements may vary between different applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

Some IHSs such as, for example, "shared infrastructure" server IHSs, are configured to share fan systems in order to realize thermal benefits such as, for example, cost reductions for cooling redundancy. For example, such server IHSs may be grouped together and positioned in a multi-server IHS chassis that utilizes one or more fan systems to provide a cooling airflow to each of the server IHSs. This allows for the use of fewer fan systems (e.g., relative to systems that provide fan systems in each server IHS) while providing aggregated redundancy, and introduces the ability to use larger and more power efficient fan systems to cool the server IHSs within their shared cooling domain. However, despite the benefits detailed above, such shared cooling solutions suffer from number of deficiencies.

For example, multi-server IHS chassis often introduce non-symmetric or otherwise unbalanced airflow paths between different server IHSs and the fan systems in the multi-server IHS chassis, which results in non-symmetric airflows in the multi-server IHS chassis and an imbalance in the amount of airflow that is provided to each of the server IHSs. For a given operating condition of the fan system(s), this can cause one or more of the server IHSs to receive insufficient airflow for cooling, particularly when the server IHSs include stress/loading/heat generation profiles that differ across the server IHSs. The solution to this issue is typically to operate the fan system(s) such that the server IHS in the multi-server IHS chassis that receives the least airflow is adequately cooled, which often results in over provision of airflow to many of the other server IHSs in the multi-server IHS chassis, as well as overconsumption of power by the cooling system.

Accordingly, it would be desirable to provide an improved cooling system for shared infrastructure IHSs.

SUMMARY

According to one embodiment, an airflow control system includes a chassis having an air inlet and defining a chassis housing; an airflow channel defined in the chassis housing adjacent the air inlet such that at least some of an airflow that enters the chassis through the air inlet is directed towards the airflow channel; and an airflow impedance element positioned in the airflow channel, wherein the airflow impedance element includes a first orientation in which the airflow impedance element impedes airflow through the airflow channel, and wherein the airflow impedance element is configured to change shape as a function of temperature into at least one second orientation that reduces the impedance of airflow through the airflow channel.

BRIEF DESCRIPTION OF THE DRAWINGS

FIG. 2b is a cut-away perspective view illustrating an embodiment of the multi-IHS chassis of FIG. 2a.

FIG. 2c is a cut-away perspective view illustrating an embodiment of the multi-IHS chassis of FIG. 2a.

FIG. 3b is cut-away, perspective view illustrating an embodiment of the IHS of FIG. 3a.

DETAILED DESCRIPTION

For purposes of this disclosure, an IHS may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an IHS may be a personal computer, a PDA, a consumer electronic device, a display device or monitor, a network server or storage device, a switch router or other network communication device, or any other suitable device and may vary in size, shape, performance, functionality, and price. The IHS may include memory, one or more processing resources such as a central processing unit (CPU) or hardware or software control logic. Additional components of the IHS may include one or more storage devices, one or more communications ports for communicating with external devices as well as various input and output (I/O) devices, such as a keyboard, a mouse, and a video display. The IHS may also include one or more buses operable to transmit communications between the various hardware components.

Figure 1:
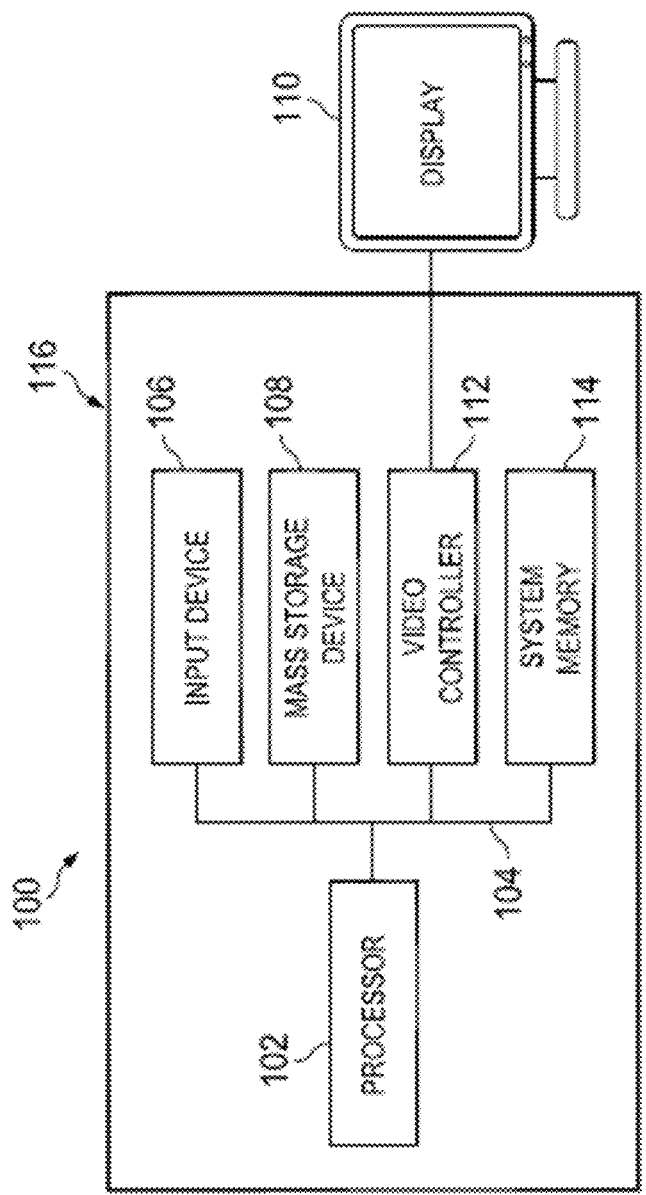
FIG. 1 is a schematic view illustrating an embodiment of an information handling system.

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2A:
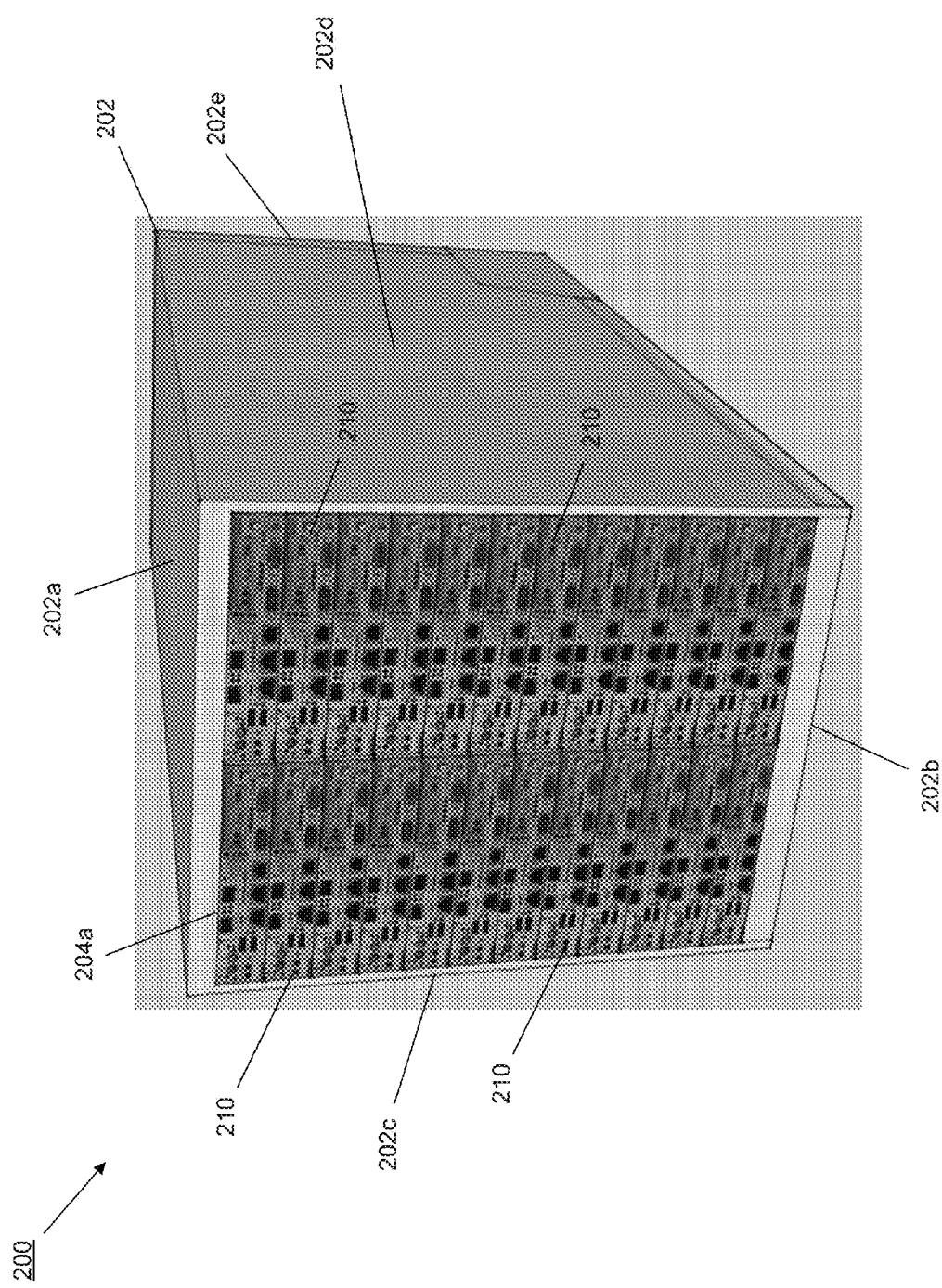
FIG. 2a is a perspective view illustrating an embodiment of a multi-IHS chassis.
Figure 2B:
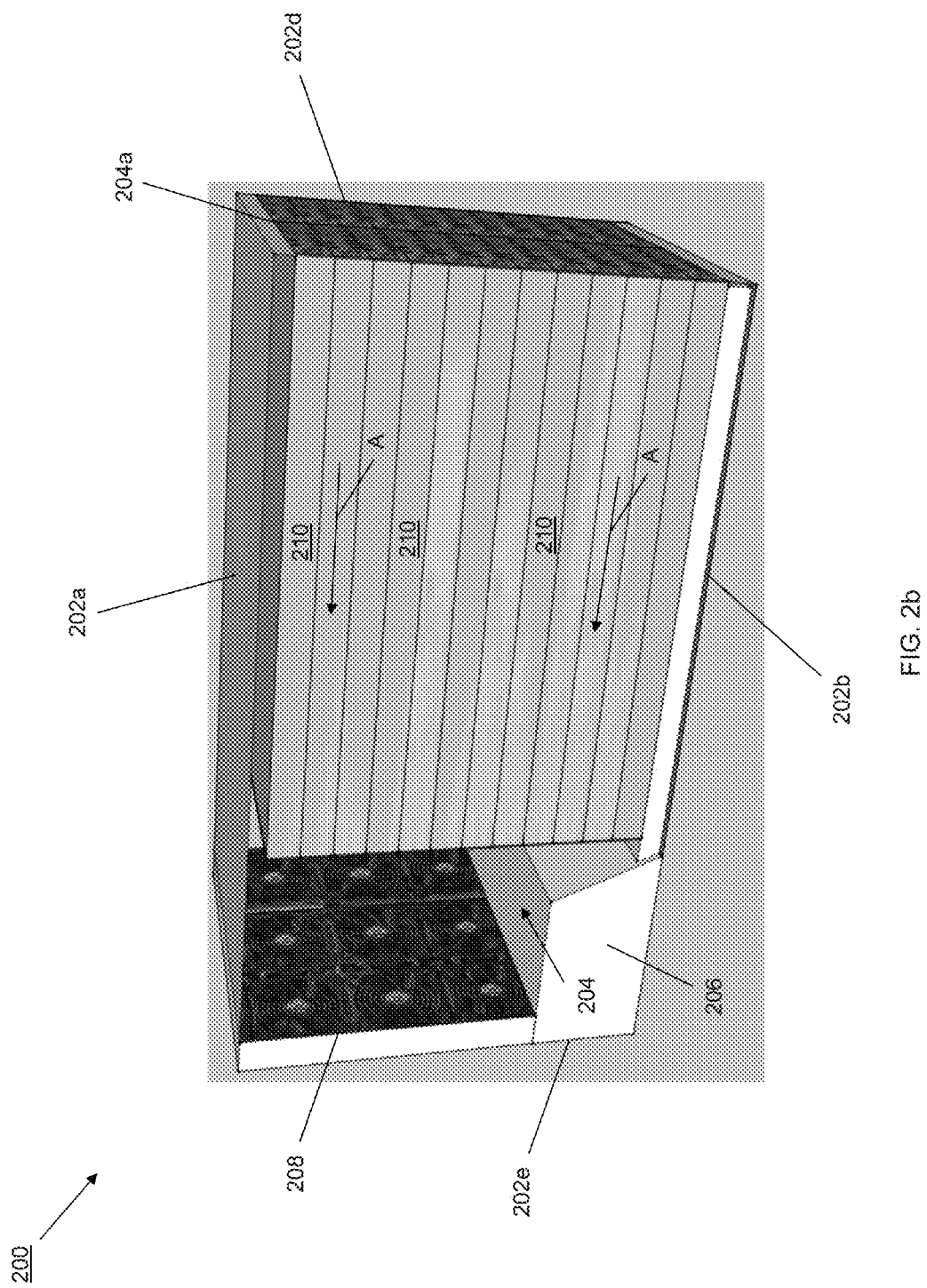

Referring now to FIGS. 2a, 2b, and 2c, an embodiment of an airflow control system 200 is illustrated that includes a multi-IHS chassis 202. The multi-IHS chassis 202 includes a top wall 202a, a bottom wall 202b located opposite the multi-IHS chassis 202 from the top wall 202a, a pair of side walls 202c and 202d located opposite the multi-IHS chassis 202 from each other and extending between the top wall 202a and the bottom wall 202b, and a rear wall 202e extending between the top wall 202a, the bottom wall 202b, and the side walls 202c and 202d. The multi-IHS chassis 202 defines a multi-IHS chassis housing 204 between the top wall 202a, the bottom wall 202b, the side walls 202c and 202d, and the rear wall 202e. The multi-IHS chassis housing 204 includes a multi-IHS chassis housing entrance 204a defined between the top wall 202a, the bottom wall 202b, and the side walls 202c and 202d and located opposite the multi-IHS chassis 202 from the rear wall 202e. In the illustrated embodiment, the multi-IHS chassis 202 includes a power supply bay 206 located adjacent the rear wall 202e of the multi-IHS chassis 202, and a plurality of fan systems 208 located on and/or providing a portion of the rear wall 202e between the top wall 202a, the bottom wall 202b, and the side walls 202c and 202d and opposite the multi-IHS chassis 202 from the multi-IHS chassis housing entrance 204a. A plurality of IHSs 210 are positioned in the multi-IHS chassis housing 204 adjacent each other and, in the illustrated embodiment, are substantially flush with the multi-IHS chassis housing entrance 204a. For example, the multi-IHS chassis 202 may include a plurality of coupling features (not illustrated, but which may be located on the side walls 202c and 202d) for coupling the IHSs 210 to the multi-IHS chassis 202. In an embodiment, the power supply bay 206 houses a power supply system that is shared by the plurality of IHSs 210 (e.g., via a plurality of power connections, not illustrated). In the illustrated embodiment, the multi-IHS chassis 202 is configured to house twenty four IHSs 210 such as, for example blade server IHSs. However, a wide variety of other multi-IHS chassis housing different numbers and types of IHSs will fall within the scope of the present disclosure.

The plurality of fan systems 208 are configured to produce an airflow through the multi-IHS chassis housing. In the embodiments discussed below, the airflow produced by the plurality of fan systems 208 draws air from the front of the multi-IHS chassis 202 (adjacent the multi-IHS chassis housing entrance 204a) and through the plurality of IHSs 210, and the plurality of fan systems 208 operate to exhaust that air out the rear of the multi-IHS chassis 202 (adjacent the rear wall 202e), as illustrated by the arrows A. However, the plurality of fan systems 208 may be configured to produce an airflow that draws air from the rear of the multi-IHS chassis 202 (adjacent the rear wall 202e), and pushes that air through the plurality of IHSs 210 and out of the front of the multi-IHS chassis 202 (adjacent the multi-IHS chassis housing entrance 204a) while remaining within the scope of the present disclosure. The multi-IHS chassis 202 with the power supply bay 206 provides an example of different impedance zones in an multi-IHS chassis, with a first impedance zone 212 located between the power supply bay 206 and the IHSs 210, and a second impedance zone 214 located between the power supply bay 206, the top wall 202a, the plurality of fan systems 208, and the IHSs 210.

One of skill in the art will recognize that multi-IHS chassis features such as the power supply bay 206 operate to produce the first impedance zone 212 that impedes airflow to the IHSs 210 located immediately adjacent the first impedance zone 212 relative to the airflow that is provided in the IHSs 210 located immediately adjacent the second impedance zone 214. As discussed above, such differing impedance zones in conventional IHS cooling systems require that the plurality of fan systems 208 be operated at a level that ensures adequate cooling of the server IHSs 210 located immediately adjacent the first impedance zone 212, which can result in overcooling of the IHSs 210 located immediately adjacent the second impedance zone 214 and the associated over consumption of power by the plurality of fan systems 208. For example, it has been found that the IHSs in the lowest impedance zones in a multi-IHS chassis may receive as much as 50% more airflow than IHSs in the highest impedance zones in the multi-IHS chassis.

Referring now to FIGS. 3a, 3b, 3c, and 3d, an embodiment of an IHS 300 is illustrated. The IHS 300 may be any of the IHSs 210 discussed above with reference to FIG. 2. In an embodiment, the IHS 300 may be the IHS 100 discussed above with reference to FIG. 1, and/or may include some or all of the components of the IHS 100. In the illustrated embodiment, the IHS 300 is a server IHS such as, for example, a blade server IHS, but the IHS may include storage IHSs, networking IHSs, and/or a variety of other IHSs known in the art. The IHS 300 includes an IHS chassis 302 having a top wall (not illustrated), a bottom wall 302a located opposite the IHS chassis 302 from the top wall, a pair of side walls 302b and 302c that are located opposite the IHS chassis 302 from each other and that extend between the top wall and the bottom wall 302a. An air inlet 304 is located on the front of the IHS chassis 302 between the top wall, the bottom wall 302a, and the side walls 302b and 302c. An air outlet 306 is located on the rear of the IHS chassis 302 (i.e., opposite the IHS chassis 302 from the air inlet 304) between the top wall, the bottom wall 302a, and the side walls 302b and 302c. The IHS chassis 302 defines an IHS chassis housing 308 that houses a plurality of IHS components 310 that may include any of the IHS components discussed above with reference to FIG. 1 (e.g., processing systems, memory systems, storage systems, networking systems, etc.). One of skill in the art will recognize that the air inlet 304 and/or the air outlet 306 may include connectors, inputs, and/or other couplings to the plurality of IHS components 310, along with vents or other openings and allow an airflow to enter and exit the IHS chassis housing 308.

A portion 308a of the IHS chassis housing 308 is located between the plurality of IHS components 310 and the top wall of the IHS chassis 302 and is substantially clear of IHS components such that an IHS chassis airflow channel is defined through the IHS chassis 302. For example, an approximately 6.5 millimeter portion 308a of the IHS chassis housing 308 may be provided in the IHS chassis 302 between its top wall and the IHS components 310, and one of skill in the art will recognize that, in response to providing an airflow through the IHS chassis 302, most of that airflow will flow through the IHS chassis airflow channel (i.e., the portion 308a of the IHS chassis housing 308) due to the plurality of IHS components 310 impeding that airflow. For example, it has been found that 80-90% of the airflow introduced into an IHS chassis similar to that illustrated in FIGS. 3a and 3b will flow through the IHS chassis airflow channel due to the IHS components 310 impeding that airflow through the remainder of the IHS chassis housing 308.

Figure 3A:
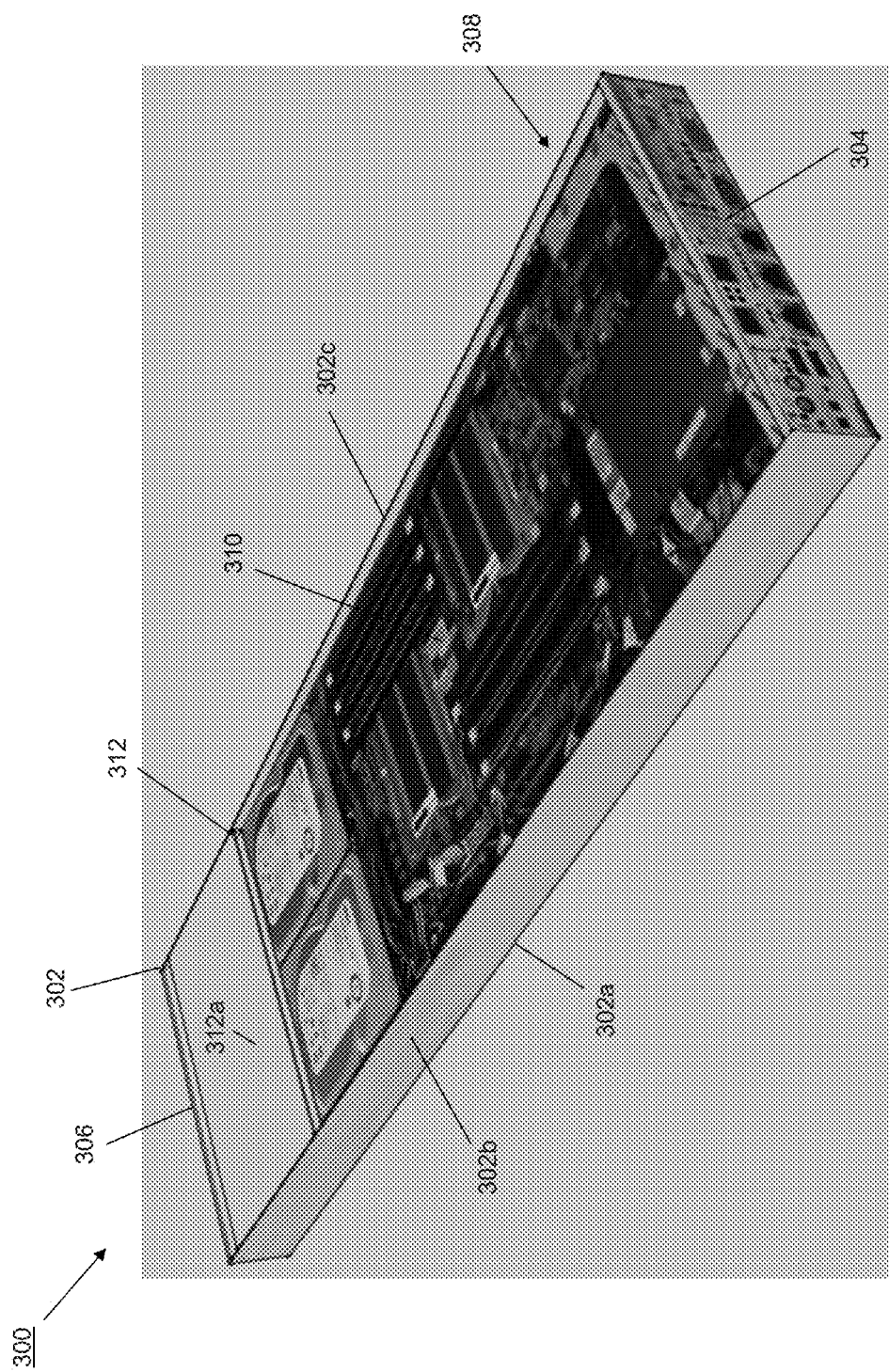
FIG. 3a is cut-away, perspective view illustrating an embodiment of an IHS in the multi-IHS chassis of FIGS. 2a, 2b, and 2c.
Figure 3B:
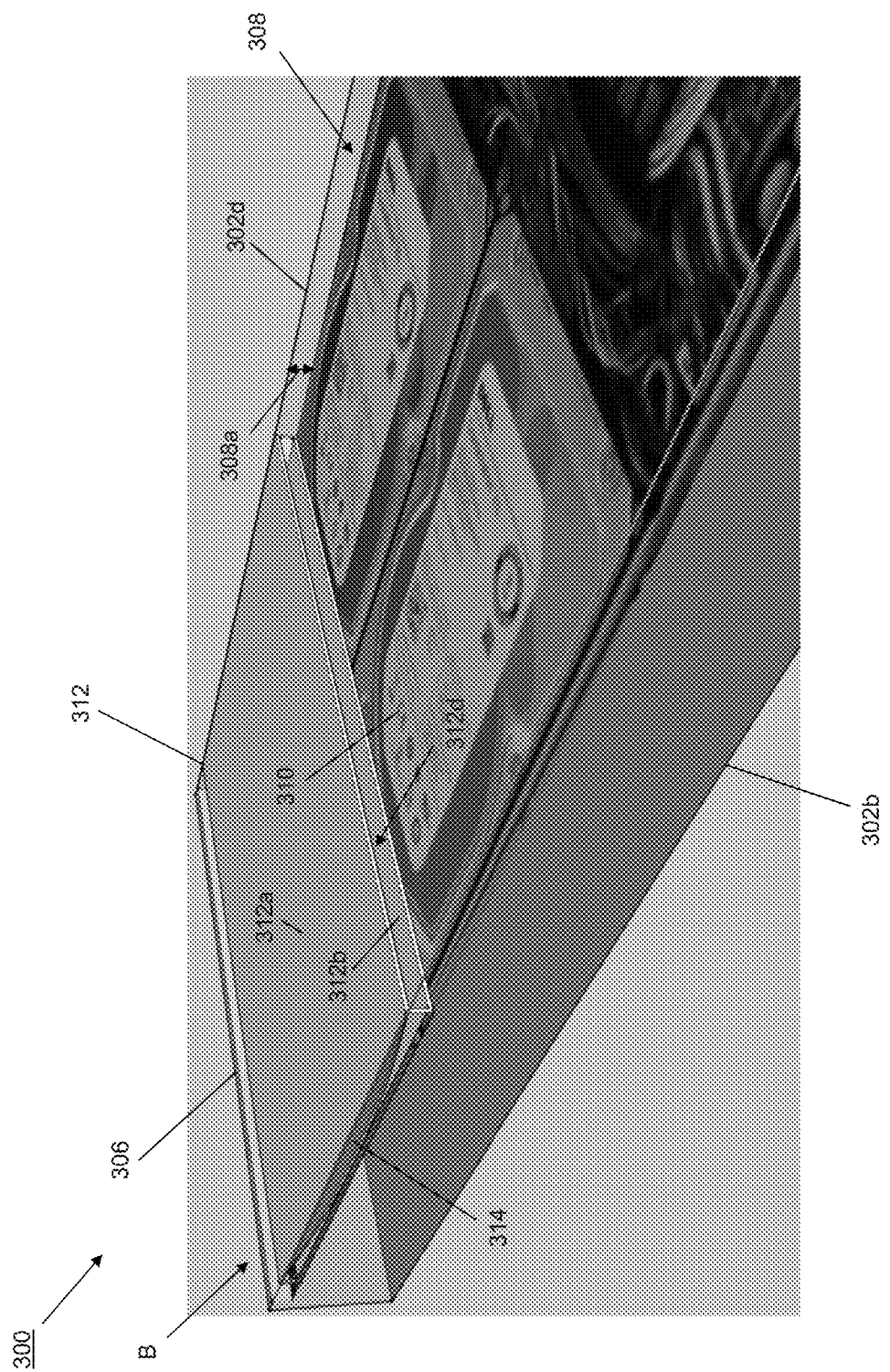

An airflow control device 312 is positioned in the portion 308a of the IHS chassis housing 308 such that the airflow control device 312 is located in the IHS chassis airflow channel. In the illustrated embodiment, the airflow control device 312 is located adjacent the air outlet 306 to realize temperature response benefits related to airflow that has been heated as it moves through the IHS chassis housing 308, discussed below, but one of skill in the art in possession of the present disclosure will recognize that the airflow control device 312 may be positioned anywhere in the IHS chassis airflow channel while remaining within the scope of the present disclosure. The airflow control device 312 includes a top wall 312a and a bottom wall 312b that are provided in a spaced-apart orientation from each other by a plurality of support members 312c such that an airflow control device channel 312d is defined between the top wall 312a and the bottom wall 312b. As illustrated in FIGS. 3a and 3b, the airflow control device 312 may be dimensioned such that, when the airflow control device 312 is positioned in the IHS chassis 302, the airflow control device channel 312d and the IHS chassis airflow channel substantially align.

An airflow impedance element 314 is included airflow control device 312. In the illustrated embodiment, the airflow impedance element 314 includes a pair of opposing edges 314a and 314b that are each coupled to the top wall 312a of the airflow control device 312. The airflow impedance element 312 may include a width that is the same as, or substantially similar to, the width of the airflow control device channel 312d. As discussed in further detail below, the air impedance element 314 is configured to change shape as a function of temperature. For example, the airflow impedance element 314 may have a first orientation B, illustrated in FIGS. 3b and 3c, at temperatures that are below a first predetermined temperature. In the illustrated first orientation B, the airflow impedance element 314 has an arcuate shape that causes the airflow impedance element 314 to extend (from its edges 314a and 314b that are coupled to the top wall 213a of the airflow control device 312) into the airflow control device channel 312d and, in some embodiments, into contact with the bottom wall 312b of the airflow control device 312 as illustrated. While the airflow impedance element 314 is illustrated as extending into contact with the bottom wall 312b of the airflow control device 312 when in the first orientation B, in some embodiments, the first orientation B of the airflow impedance element 314 may provide the airflow impedance element 314 spaced apart from the bottom wall 312b of the airflow control device 312 by a relatively small amount (e.g., 0.5-1 millimeter) to allow some airflow through the airflow control device channel 312d when the airflow impedance element 314 is in the first orientation B. In embodiments in which a gap is provided between the airflow impedance element 314 and the bottom wall 312b of the airflow control device 312 when the airflow impedance element 314 is in the first orientation B, the size of that gap may be selected (e.g., by configuring the airflow control device 312 and/or the airflow impedance element 314) to provide a minimal amount of airflow needed to allow for the temperature responses/shape changes of the airflow impedance element discussed below.

Figure 3C:
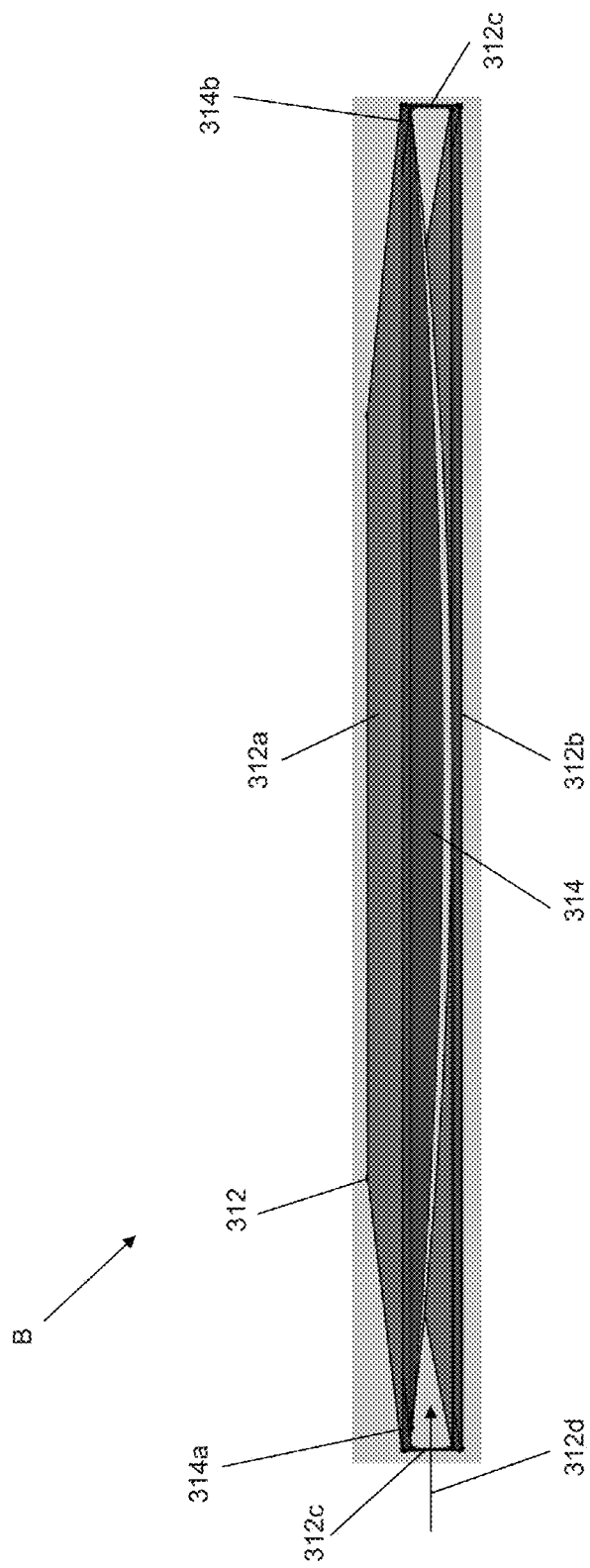
FIG. 3c is side perspective view illustrating an embodiment of an airflow control device in the IHS of FIGS. 3a and 3b with an airflow impedance element in a first orientation.
Figure 3D:
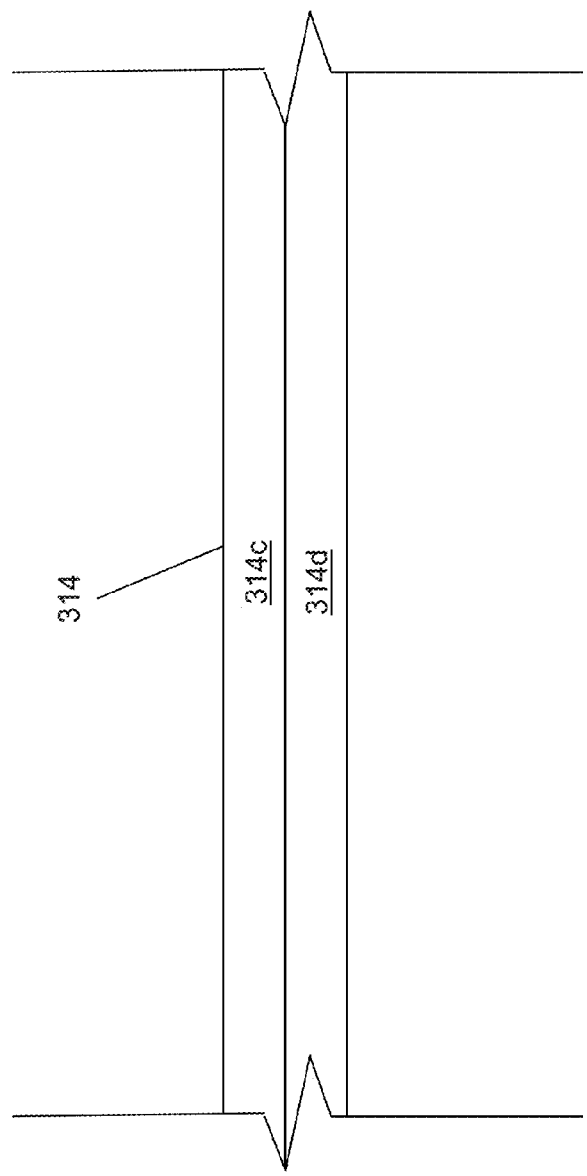
FIG. 3d is side view illustrating an embodiment of a bimetallic plate in the airflow control device of FIG. 3c.

In a specific embodiment, the airflow impedance element 314 may include a bimetallic plate having a first layer 314c and a second layer 314d that are coupled together using methods known in the art, as illustrated in FIG. 3d. The first layer 314c and the second layer 314d may have different thermal expansion coefficients such that when the bimetallic plate experiences an increase in temperature, the resulting forces between the different thermal expansions of the first layer 314c and 314d (along with their coupled-together configuration) cause the bimetallic plate to change shape as discussed below. For example, the airflow impedance element 314/bimetallic plate may include the first layer 314c that includes a steel material such as, for example, stainless steel (e.g., a 0.1 millimeter thick layer of stainless steel), and the second layer 314d that includes a copper material such as, for example, copper (e.g., a 0.1 millimeter thick layer of copper). One of skill in the art in possession of the present disclosure will recognize how the layers of the bimetallic plate may be selected based on thermal expansion properties, dimensioned, coupled together, and/or otherwise configured to provide the different temperature dependent orientations of the airflow impedance element 314 described below.

While a specific example of a bimetallic plate has been provided, more than two layers may be used in the airflow impedance element 314/bimetallic plate, other metal materials may be used in the layers of the airflow impedance element 314/bimetallic plate, non-metal materials may be used in the layers of the airflow impedance element 314/bimetallic plate, and/or a variety of other modifications may be made to the bimetallic plate described above that will allow for the functionality of the airflow impedance element 314 and that are envisioned as falling within the scope of the present disclosure. Furthermore, the airflow impedance element 314 may include devices, materials, or systems other than bimetallic plates that change shape as a function of temperature while remaining within the scope of the present disclosure. In some embodiments, the airflow impedance element 314 may be included in or integrated with the IHS chassis 302 rather than being included in an airflow control device 312 that is coupled to the IHS chassis 302. For example, the airflow impedance element 314 may be coupled to the top wall of the IHS chassis 302, and the airflow impedance element 314 may be configured such that it extends into the IHS chassis airflow channel (e.g., in contact with the IHS components 310 or slightly spaced apart from the IHS components 310) to impede airflow through the IHS chassis airflow channel when in the first orientation as discussed above. Further still, the positioning of the airflow impedance element may be moved from within the IHS chassis to a location in the multi-IHS chassis 202 that controls airflow produced through the IHS chassis (e.g., adjacent the IHS chassis or in a channel that provides airflow to the IHS chassis) while remaining within the scope of the present disclosure.

Figure 4:
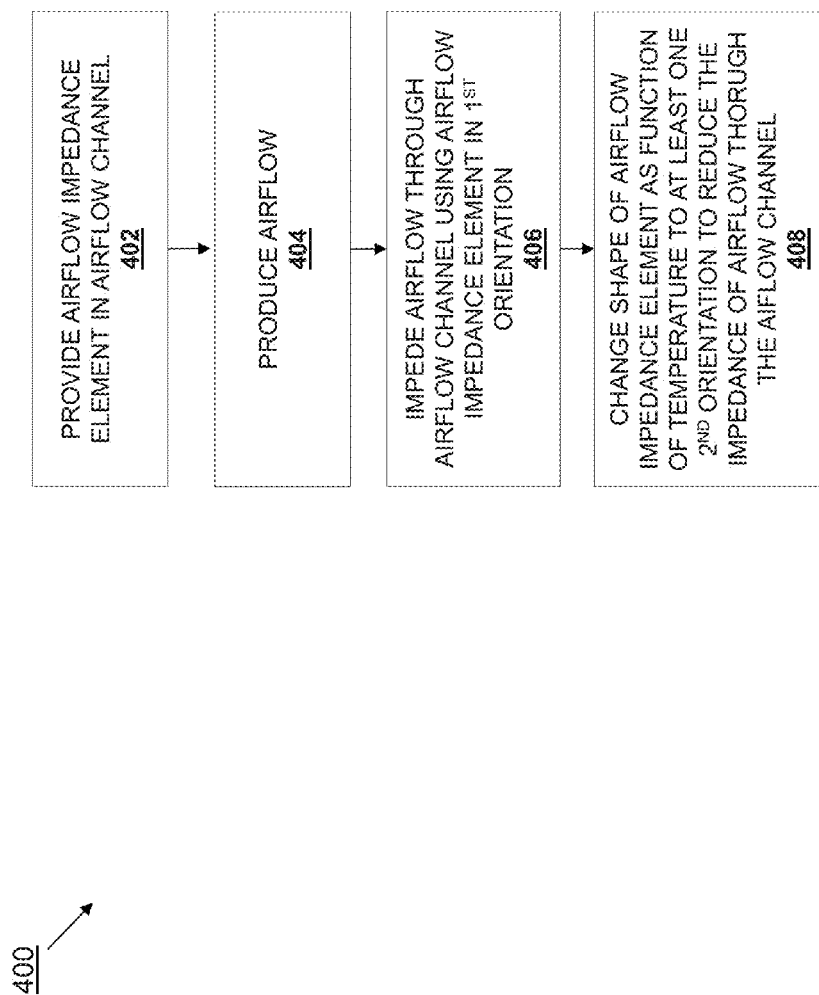
FIG. 4 is a flow chart illustrating an embodiment of a method for airflow control.

Referring now to FIG. 4, an embodiment of a method 400 for airflow control is illustrated. The method 400 begins at block 402 where an airflow impedance element is provided in an airflow channel. In an embodiment, an airflow control device 312 including the airflow impedance element 314 is provide in each of a plurality of IHSs 210/300 as discussed above, and each of the plurality of IHSs 210/300 are positioned in the multi-IHS chassis 202 as discussed above. However, in other embodiments, the airflow impedance element 314 may be provided as part of or integrated into the IHS chassis of each of the plurality of IHSs 210/300 that are positioned in the multi-IHS chassis 202, as part of the multi-IHS chassis 202, etc. Furthermore, the method 400 may be applied to non-IHS situations in order to control airflow in any of a variety of airflow provisioning situations that will fall within the scope of the present disclosure. For example, any parallel airflow system (e.g., a building cooling system) that provides a shared airflow to multiple different components or zones may benefit from the teachings of the present disclosure and will fall within its scope.

The method 400 then proceeds to block 404 where an airflow is produced. In an embodiment, the fan systems 208 may be operated to produce an airflow through the multi-IHS chassis 202 (e.g., through the multi-IHS chassis entrance 204a, the IHSs 210, the multi-IHS chassis housing 204, and through the fan systems 208 to exit the multi-IHS chassis 202 through the rear wall 202e). In an embodiment, the fan systems 208 may be coupled to a fan controller that receives temperature information from each of the plurality of IHSs 210, and the fan systems 208 may be controlled by the fan controller using that temperature information. Furthermore, a variety of other systems and system information may be utilized by the fan controller to provide the airflow at block 404.

Figure 5A:
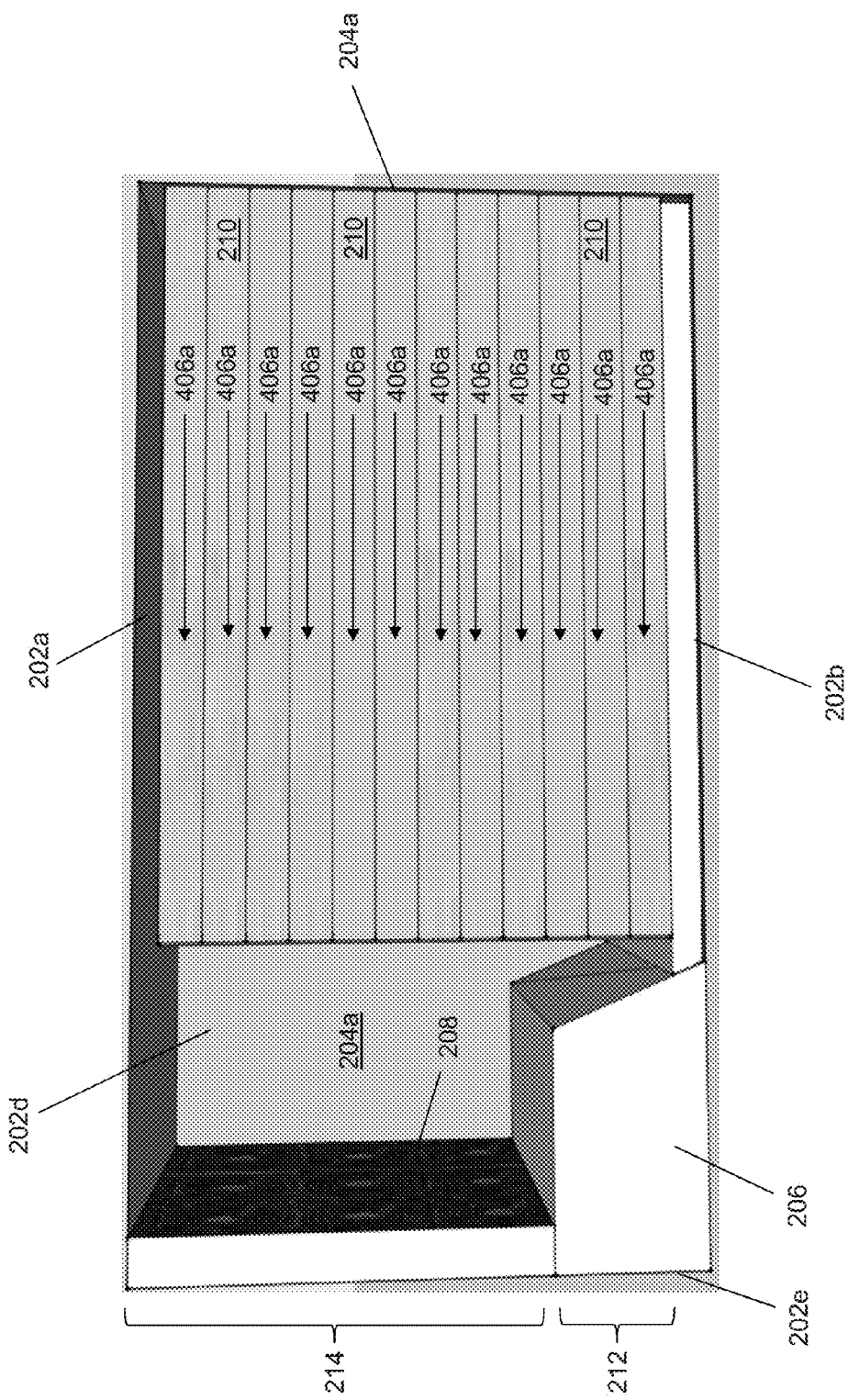
FIG. 5a is a cut-away perspective view illustrating an embodiment of the multi-IHS chassis of FIG. 2a including an example of cooling airflow through IHSs in the multi-IHS chassis.

The method 400 then proceeds to block 406 where airflow is impeded through the airflow channel using the airflow impedance element in the first orientation. With reference to FIGS. 3b and 3c and as discussed above, the airflow impedance element 314 may have the first orientation B at temperatures that are below a first predetermined temperature, and in the illustrated first orientation B, the airflow impedance element 314 has an arcuate shape that causes the airflow impedance element 314 to extend into the airflow control device channel 312d and into contact with the bottom wall 312b of the airflow control device 312. As such, at block 406 when temperature are below the first predetermined temperature, the airflow impedance element 314 will impede the airflow through airflow control device channel 312d (and the IHS chassis airflow channel) due to having the first orientation B. In some embodiments in which the airflow impedance element 314 extends into the airflow control device channel 312d and into contact with the bottom wall 312b of the airflow control device 312, some airflow may be allowed through the plurality of IHS components such that the airflow can move through the IHS chassis 302 and past the airflow impedance element 314. In embodiments where the first orientation B of the airflow impedance element 314 provides the airflow impedance element 314 extending into the airflow control device channel 312d but spaced apart from the bottom wall 312b of the airflow control device 312, some airflow is allowed through the airflow control device channel 312d (i.e., through that gap) such that the airflow can move through the IHS chassis 302 and past the airflow impedance element 314. FIG. 5a illustrates a plurality of substantially similar airflows 406a through the IHSs 210 that may result following an initial startup of the IHSs 210 and when each of the IHSs 210 is at a similar, relatively low temperature (e.g., a temperature below the predetermined temperature discussed above at which the airflow impedance elements 314 in those IHSs 210 are in the first orientation). As such, the airflow impedance elements 314 in the IHSs 210 may substantially impede the airflow through their associated IHS chassis airflow channel when the temperature of those airflow impedance elements 314 is below a predetermined temperature.

The method 400 then proceeds to block 408 where the shape of the airflow impedance element is changed as a function of temperature to at least one second orientation to reduce the impedance of airflow through the airflow channel. In an embodiment, as any of the IHSs 210 are utilized such that their IHS components 310 generate heat, that heat may be transferred to the airflow impedance element 314. For example, the generation of heat by the IHS components 310 in an IHS 210/300 may be transferred to the airflow (e.g., the airflow 406a discussed above with reference to block 406) provided through the IHS chassis airflow channel, and that airflow will then contact the airflow impedance element 314 such that heat is transferred to the airflow impedance element 314. In embodiments where the airflow control device 312 and/or airflow impedance element 314 are positioned adjacent the airflow outlet 306, such positioning may enhance the temperature response of the airflow impedance element 314 by ensuring that the airflow may transfer as much heat as possible from the IHS components 310 prior to contacting the airflow impedance element 314. However, other positioning of the airflow control device 312 and/or airflow impedance element 314 (and possibly associated "tuning" of the temperature response of the airflow impedance element 314 to compensate for relatively less heating of the airflow) will fall within the scope of the present disclosure.

Figure 5B:
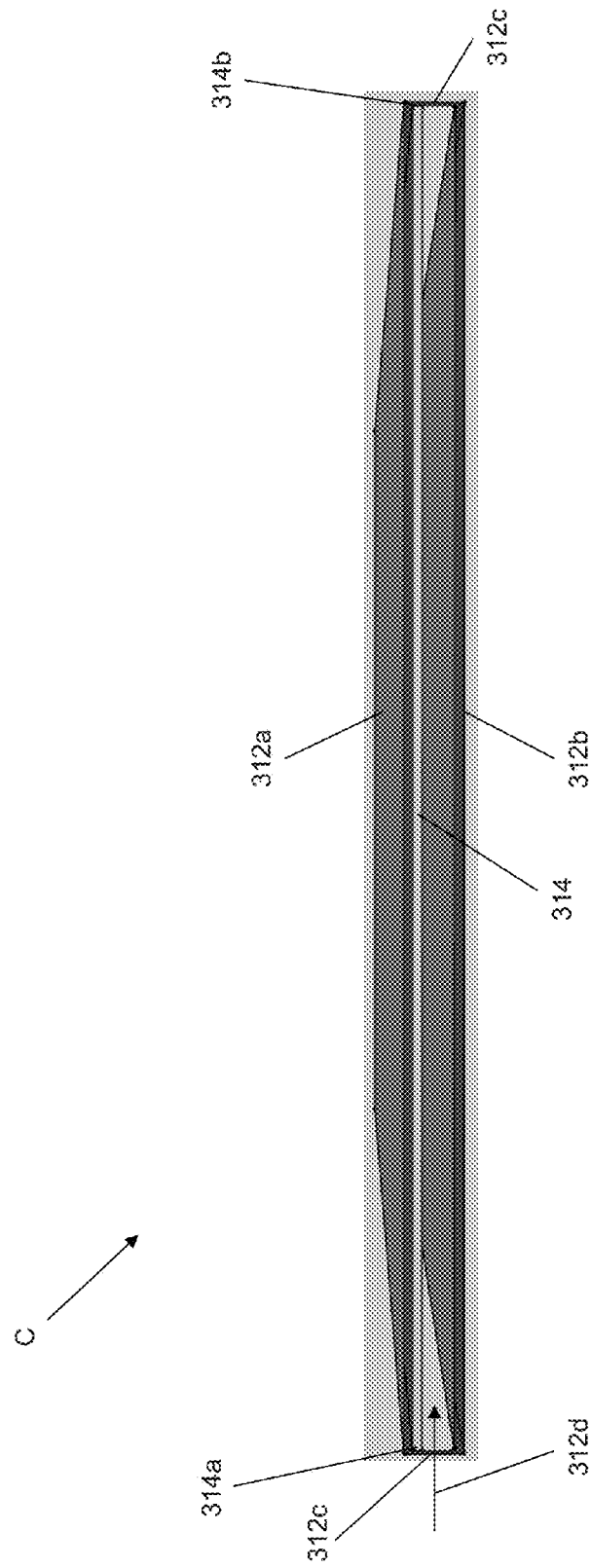
FIG. 5b is side view illustrating an embodiment of the airflow control device of FIG. 3c with the airflow impedance element in a second orientation.

Referring to FIGS. 3b, 3c and 5b, the transfer of heat to the airflow impedance element 314 may cause the airflow impedance element 314 to change shape into one or more second orientations that reduce the impedance of the airflow through the airflow channel. For example, the transfer of heat from the airflow to the airflow impedance element 314 to increase the temperature of the airflow impedance element 314 above a predetermined temperature may cause the airflow impedance element 314 to change shape from the first orientation B illustrated in FIGS. 3b and 3c to a second orientation C illustrated in FIG. 5b. In the illustrated embodiment, the second orientation C provides the airflow impedance element 314 with a substantially flat shape that does not extend into the airflow control device channel 312d. One of skill in the art in possession of the present disclosure will recognize that the airflow impedance element 314 may move through a plurality of second orientations that reduce the impedance of the airflow through the airflow channel as the airflow impedance element 314 changes its shape as a function of increasing temperature, and that the airflow impedance element 314 may be configured to change its shape in a manner that reduces the impedance of the airflow through the airflow channel a desired incremental amount for incremental increases in temperature (e.g., to increase the distance between the airflow impedance element 314 and the bottom wall 312b of the airflow control device by 0.3 mm for each 1 degree Celsius of temperature increase above the predetermined temperature). For example, the airflow impedance element 314 may be configured to change shape between the first orientation B and the second orientation C over a range of 10 degrees Celsius. In an embodiment, the curvature change of an airflow impedance element 314/bimetallic plate may occur according to the formula below:

$$\kappa = (6E_1E_2(h_1+h_2)h_1h_2\epsilon)/(E_1^2h_1^4 + 4E_1E_2h_1^3h_2 + 6E_1E_2h_1^2h_2^2 + 4E_1E_2h_2^3h_1 + E_2^2h_2^4$$

Where $E_1$ is the Young's modulus of a first layer of the airflow impedance element 314, $E_2$ is is the Young's modulus of a second layer of the airflow impedance element 314, $h_1$ is the thickness of the first layer of the airflow impedance element 314, $h_2$ is the thickness of the second layer of the airflow impedance element 314, and E is the difference in strain of the first layer and the second layer of the airflow impedance element 314. However, the formula above is merely provided as an example, and different types of airflow impedance elements may have their curvature defined by different formulas while remaining within the scope of the present disclosure.

Figure 5C:
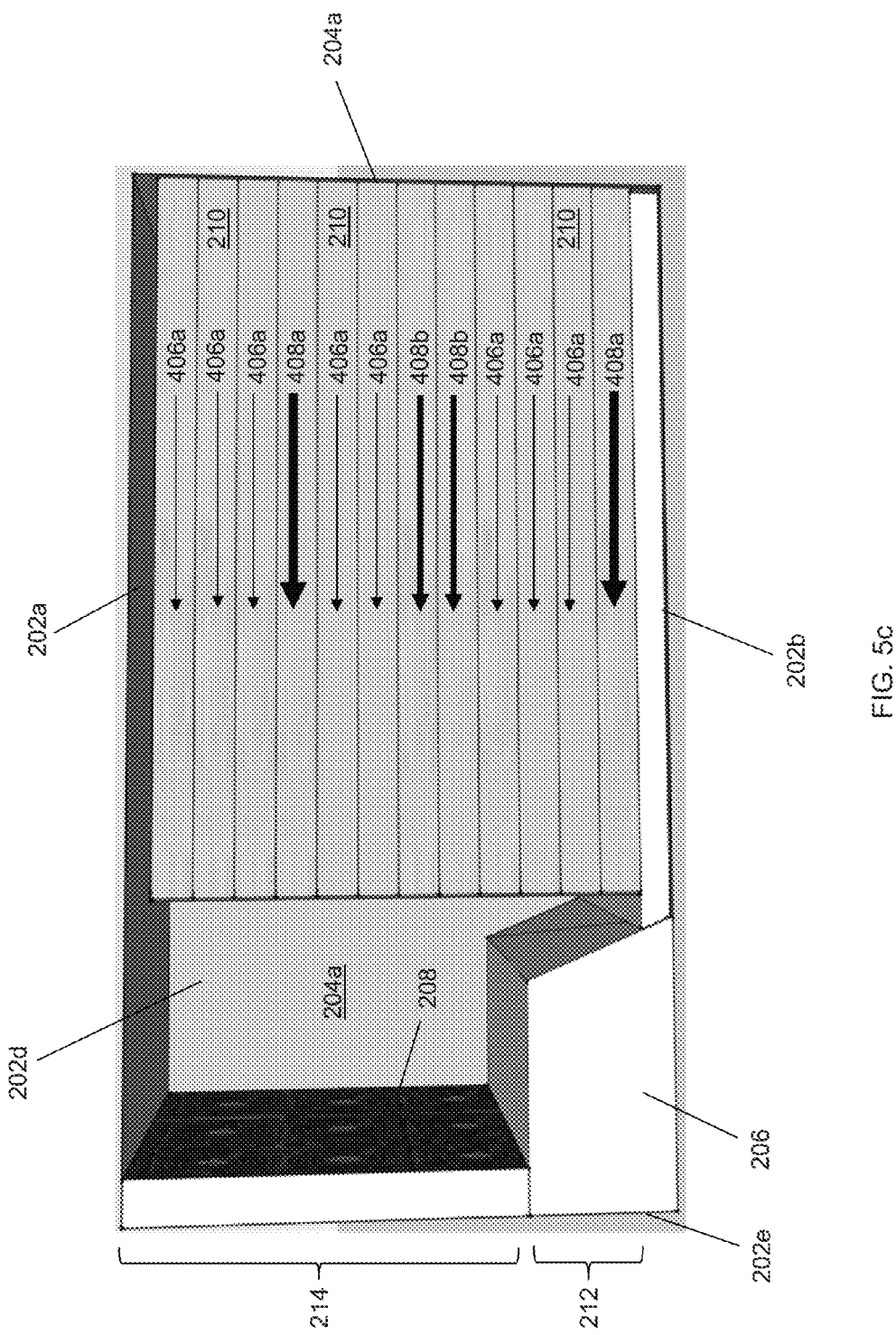
FIG. 5c is a cut-away perspective view illustrating an embodiment of the multi-IHS chassis of FIG. 2a including an example of cooling airflow through IHSs in the multi-IHS chassis.

In specific examples where the airflow impedance element 314 is a bimetallic plate (e.g., as illustrated in FIG. 3d), the continued increase in temperature of the airflow impedance element 314/bimetallic plate (e.g., above the predetermined temperature discussed above) may cause the layer 314d to thermally expand faster than the layer 314c, and that expansion differential, along the coupling of the layers 314c and 314d, may cause the airflow impedance element 314 to "straighten out" from the arcuate shape illustrated in FIGS. 3b and 3c to the flat shape illustrated in FIG. 5b over a desired range of temperatures. FIG. 5c provides an example of the system illustrated in FIG. 5a after an amount of time in which some of the IHSs 210 have begun to generate more heat than others of the IHSs 210 (e.g., due to different stress/loading/heat generation profiles), and illustrates some increased airflows 408a and 408b through the IHSs 210 (indicated by weighted arrows in FIG. 5c) that may result following the heating up of the airflow impedance element 314 in those IHSs 210 and the subsequent reduction of the impedance of the airflow through those IHSs 210 as discussed above. For example, the airflows 408b indicated by the medium weighted arrows may be produced in response to IHS components in associated IHSs 210 heating the airflow to an intermediate level that causes the associated airflow impedance elements 314 to reduce the impedance of the airflow an intermediate level (e.g., by changing shape to an orientation that is between the first orientation B illustrated in FIGS. 3b and 3c and the second orientation C illustrated in FIG. 5). The airflows 408a indicated by the heavy weighted arrows may be produced in response to IHS components in associated IHSs 210 heating the airflow to a relatively high level that causes the associated airflow impedance elements 314 to reduce the impedance of the airflow as much as possible (e.g., by changing shape to the second orientation C illustrated in FIG. 5).

As such, the airflow impedance elements 314 in each of the IHSs 210 may operate to impede airflow through their IHSs 210 as long as the temperature is below a predetermined temperature, and as the IHS components in their IHSs 210 heat up, the impedance of that airflow will be reduced through the heating and subsequent shape change of the airflow impedance element in that IHS 210. Thus, IHSs that would be over-cooled in conventional systems will have the airflow through them impeded by their airflow impedance elements, which will result in airflow being directed to the IHSs that need cooling. In addition, the IHSs that need cooling will, by virtue of the increased temperature of their exhaust airflow contacting their airflow impedance elements, have their airflow impedance elements 314 change shape to reduce the impedance of the airflow they receive, thus further directing airflow to the IHSs that need cooling. As such, systems and methods have been described that utilize an airflow impedance element that changes shape as a function of temperature such as, for example, a bimetallic plate, in order to provide an airflow control system that does not need to be powered and that operates to direct airflow from a shared cooling system to the components that most need that airflow for cooling purposes. One of skill in the art will recognize that the systems and methods of the present disclosure provide for an optimized distribution of the airflow produced by one or more fan systems, and will result in the need for less airflow from the fan systems, thus reducing the power consumed by the fan systems.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. An airflow control system, comprising:
   a chassis including an air inlet and defining a chassis housing;
   an airflow channel defined in the chassis housing adjacent the air inlet such that at least some of an airflow that enters the chassis through the air inlet is directed towards the airflow channel; and
   an airflow impedance element positioned in the airflow channel, wherein the airflow impedance element includes a first orientation in which the airflow impedance element impedes airflow through the airflow channel, and wherein the airflow impedance element is configured to change shape as a function of temperature into at least one second orientation that reduces the impedance of airflow through the airflow channel.

2. The airflow control system of claim 1, wherein the airflow impedance element is a bimetallic plate.

3. The airflow control system of claim 2, wherein the bimetallic plate includes a first layer having a steel material and a second layer having a copper material.

4. The airflow control system of claim 1, further comprising:
   an airflow control device that defines the airflow channel, wherein the airflow control device is positioned in the chassis housing between a chassis wall and a plurality of heat producing components.

5. The airflow control system of claim 1, wherein the airflow impedance element includes an arcuate shape when in the first orientation such that the airflow impedance element extends into the airflow channel, and wherein the airflow impedance element is configured to change as the function of temperature from the arcuate shape into a flat shape that provides one of the at least one second orientation.

6. The airflow control system of claim 5, wherein the airflow impedance element is configured to change from the arcuate shape to the flat shape over a range of approximately 10 degrees Celsius.

7. An information handling system (IHS) cooling system, comprising:
   a multi-IHS chassis including at least one fan system that is configured to produce an airflow through the multi-IHS chassis; and
   a plurality of IHSs positioned in the multi-IHS chassis, wherein each of the plurality of IHSs includes:
   an IHS chassis;
   a processing system housed in the IHS chassis;
   a memory system housed in the IHS chassis;
   an airflow channel defined within the IHS chassis, wherein the airflow channel is configured to receive at least a portion of the airflow produced by the at least one fan system; and an airflow impedance element positioned in the airflow channel, wherein the airflow impedance element includes a first orientation in which the airflow impedance element extends into the airflow channel to impede airflow through the airflow channel, and wherein the airflow impedance element is configured to change shape as a function of temperature into at least one second orientation that reduces the impedance of airflow through the airflow channel.

8. The IHS cooling system of claim 7, wherein the airflow impedance element is a bimetallic plate.

9. The IHS cooling system of claim 8, wherein the bimetallic plate includes a first layer having a steel material and a second layer having a copper material.

10. The IHS cooling system of claim 7, wherein at least one of the plurality of IHSs includes:
an airflow control device that defines the airflow channel, wherein the airflow control device is positioned within the IHS chassis between a chassis wall and each of the processing system and the memory system.

11. The IHS cooling system of claim 7, wherein the airflow impedance element includes an arcuate shape when in the first orientation such that the airflow impedance element extends into the airflow channel, and wherein the airflow impedance element is configured to change as the function of temperature from the arcuate shape into a flat shape that provides one of the at least one second orientation.

12. The IHS cooling system of claim 11, wherein the airflow impedance element is configured to change from the arcuate shape to the flat shape over a range of approximately 10 degrees Celsius.

13. The IHS cooling system of claim 7, wherein the multi-IHS chassis includes a first impedance zone that has a higher airflow impedance than at least one second impedance zone in the multi-IHS chassis, and wherein at least one of the plurality of IHSs positioned in the first impedance zone.

14. A method for airflow control, comprising:
providing an airflow impedance element in an airflow channel defined in a chassis;
impeding an airflow through the airflow channel using the airflow impedance element in a first orientation in which the airflow impedance element blocks a portion of the airflow channel, wherein the airflow impedance element has the first orientation below a predetermined temperature; and
changing the shape of the airflow impedance element as a function of increasing temperature above the predetermined temperature to at least one second orientation that reduces the impedance of airflow through the airflow channel by reducing the portion of the airflow channel that is blocked by the airflow impedance element.

15. The method of claim 14, wherein the airflow impedance element is a bimetallic plate.

16. The method of claim 15, wherein the bimetallic plate includes a first layer having a steel material and a second layer having a copper material.

17. The method of claim 14, wherein an airflow control device that defines the airflow channel is positioned within the chassis between a chassis wall and at least one heat producing component.

18. The method of claim 14, wherein the airflow impedance element includes an arcuate shape when in the first orientation such that the airflow impedance element extends into the airflow channel to block the portion of the airflow channel, and wherein the airflow impedance element is configured to change as the function of temperature from the arcuate shape into a flat shape that provides one of the at least one second orientation.

19. The method of claim 18, wherein the airflow impedance element is configured to change from the arcuate shape to the flat shape over a range of approximately 10 degrees Celsius.

20. The method of claim 14, further comprising:
providing the airflow using a fan system in a multi-IHS chassis.

* * * * *